(12) United States Patent
Ishikawa

(10) Patent No.: US 6,822,897 B2
(45) Date of Patent: Nov. 23, 2004

(54) THIN FILM MAGNETIC MEMORY DEVICE SELECTING ACCESS TO A MEMORY CELL BY A TRANSISTOR OF A SMALL GATE CAPACITANCE

(75) Inventor: Masatoshi Ishikawa, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 117 days.

(21) Appl. No.: 10/241,696

(22) Filed: Sep. 12, 2002

(65) Prior Publication Data

US 2003/0185065 A1 Oct. 2, 2003

(30) Foreign Application Priority Data

Mar. 26, 2002 (JP) ........................................ 2002-085700

(51) Int. Cl.$^7$ .............................................. G11C 11/14
(52) U.S. Cl. ........................................ 365/171; 365/161
(58) Field of Search ................................ 365/171, 161, 365/148, 97, 122

(56) References Cited

U.S. PATENT DOCUMENTS

| | | | | |
|---|---|---|---|---|
| 6,504,752 | B2 | * 1/2003 | Ito | ................................ 365/158 |
| 6,560,135 | B2 | * 5/2003 | Matsuoka et al. | ................ 365/97 |
| 6,587,370 | B2 | * 7/2003 | Hirai | ............................. 365/171 |
| 6,614,681 | B2 | * 9/2003 | Hidaka | .......................... 365/171 |

OTHER PUBLICATIONS

"A 10ns Read and Write Non–Volatile Memory Array Using a Magnetic Tunnel Junction and FET Switch in Each Cell", Scheuerlein et al., ISSCC Digest of Technical Papers, TA7.2, Feb. 2000,, pp. 94–95, 128–129, 409–410.
"Nonvolatile RAM based on Magnetic Tunnel Junction Elements", Durlam et al., ISSCC Digest of Technical Papers, TA7.3, Feb. 2000, pp. 96–97, 130–131, 410–411.
"A 256kb 3.0V 1T1MTJ Nonvolatile Magnetoresistive RAM", Naji et al., ISSCC Digest of Technical Papers, TA7.6, Feb. 2001, pp. 94–95, 122–123, 404–405, 438.
U.S. patent application Ser. No. 09/834,638, Hidaka, filed Apr. 16, 2001.

* cited by examiner

Primary Examiner—Thong Q. Le
(74) Attorney, Agent, or Firm—McDermott Will & Emery LLP

(57) ABSTRACT

A memory array is provided with first MTJ memory cells arranged in alternate rows and second MTJ memory cells arranged in other alternate rows and each having a layout inverted in a Y direction with respect to the first MTJ memory cell. In each memory cell column, first and second transistor gate interconnections are arranged in the Y direction. In the first MTJ memory cell, a gate of a transistor provided as an access element is connected to the first transistor gate interconnection. In the second MTJ memory cell, a gate of a transistor provided as an access element is connected to the second transistor gate interconnection.

12 Claims, 13 Drawing Sheets

THIN FILM MAGNETIC MEMORY DEVICE SELECTING ACCESS TO A MEMORY CELL BY A TRANSISTOR OF A SMALL GATE CAPACITANCE

BACKGROUND OF THE INVENTION

1. Field of the Invention

The present invention relates to a thin film magnetic memory device, and particularly to a thin film magnetic memory device provided with memory cells having MTJs (Magnetic Tunnel Junctions).

2. Description of the Background Art

In recent years, attention has been given to a MRAM (Magnetic Random Access Memory) as a storage device, which can nonvolatilely store data with low power consumption. The MRAM device uses a plurality of thin film magnetic elements formed in a semiconductor integrated circuit for nonvolatilely storing data, and can perform random access to the thin film magnetic elements and others.

FIG. 15 conceptually shows a data storing principle of a memory cell having a magnetic tunnel junction, which will be merely referred to as an "MTJ memory cell" hereinafter.

Referring to FIG. 15, the MTJ memory cell includes a tunneling magneto-resistance element TMR having a MR (Magneto-Resistive) effect, in which an electric resistance of a material changes depending on a direction of magnetization of a magnetic material. As a distinctive feature, tunneling magneto-resistance element TMR can achieve a remarkable MR effect and a high MR ratio (electric resistance ratio depending on the magnetization direction) even at a room temperature.

Tunneling magneto-resistance element TMR includes ferromagnetic material films 201 and 202 as well as an insulating film (tunneling film) 203. In tunneling magneto-resistance element TMR, a magnitude of a tunneling current flowing through insulating film 203, which is located between ferromagnetic material films 201 and 202, changes in accordance with a direction of spin of electrons, which depends on the magnetization directions of ferromagnetic material films 201 and 202. The number of states, which spin electrons in ferromagnetic material films 201 and 202 can enter, depends on the magnetization direction. Therefore, the tunneling current increases when ferromagnetic material films 201 and 202 are magnetized in the same direction. When these are magnetized in the opposite directions, respectively, the tunneling current decreases.

This phenomenon is utilized as follows. The magnetization direction of ferromagnetic material film 202 is switched in accordance with storage data while fixing the magnetization direction of ferromagnetic material film 201, and the magnitude of the tunneling current flowing through tunneling film 203 and thus the electric resistance of tunneling magneto-resistance element TMR are detected. Thereby, the tunneling magneto-resistance element TMR can be used as a memory cell for storing data of one bit. The magnetization direction of ferromagnetic material film 201 is fixed by an antiferromagnetic material or the like, and is generally referred to as a "spin valve".

In the following description, ferromagnetic material film 201 having a fixed magnetization direction may also referred to as a "fixed magnetic film 201", and ferromagnetic material film 202 having a magnetization direction corresponding to the storage data may also be referred to as a "free magnetic film 202".

For achieving a memory device having a high density, it is desired that MTJ memory cells formed of such tunneling magneto-resistance element TMRs are arranged in a two-dimensional array form. In general, the ferromagnetic material has a direction, which allows easy magnetization owing to crystal structures, forms and others (and thus requires a low energy for magnetization), and this direction is generally referred to as an easy axis. The magnetization direction of free magnetic film 202 corresponding to the storage data is set along this easy axis. Conversely, the direction, in which the ferromagnetic material cannot be magnetized easily (and a high energy is required for magnetization), is referred to as a hard axis.

FIG. 16 conceptually shows data write magnetic fields applied to the MTJ memory cell in a data write operation.

In FIG. 16, an abscissa gives a data write magnetic field H(EA) in the direction of the easy axis, and an ordinate gives a data write magnetic field H(HA) in the direction of the hard axis. When a vector sum of data write magnetic fields H(EA) and H(HA) reaches a region exceeding an asteroid curve 205, the magnetization direction of tunneling magneto-resistance element TMR (magnetization direction of free magnetic film 202) is rewritten into the direction of the easy axis.

Conversely, when the data write magnetic field within the region surrounded by asteroid curve 205 is applied, the magnetization direction of tunneling magneto-resistance element TMR is not renewed, and the stored contents are nonvolatilely held.

As shown in FIG. 16, data write magnetic field H(EA) required for the data writing is reduced by simultaneously applying data write magnetic field H(HA). Thus, operation points 206 and 207 during the data writing are represented by vector sums of data write magnetic field H(HA) in the uniform direction not affected by the write data and data write magnetic field H(EA) in the direction corresponding to the write data. Further, each of the data write magnetic fields H(HA) and H(EA) at operation points 206 and 207 is designed not to reach the region exceeding asteroid curve 205.

FIG. 17 conceptually shows an arrangement of data write interconnections in the memory cell array formed of the MTJ memory cells.

Referring to FIG. 17, the memory cell array, in which tunneling magneto-resistance elements TMR each forming the MTJ memory cell are arranged in rows and columns, is provided with data write lines 210 and 215 arranged in a grid-like form. Each of data write lines 210 and 215 is supplied with a data write current for generating or the other of data write magnetic fields H(EA) and H(HA).

For example, data write line 210 generates data write magnetic field H(HA), and data write line 215 generates data write magnetic field H(EA). For this, data write line 210 is selectively supplied with the data write current in the uniform direction, and data write line 215 is selectively supplied with the data write current in the direction corresponding to the write data. For the MTJ memory cell, which is designated as a target of data writing, corresponding data write interconnections 210 and 215 are both supplied with the data write currents.

Therefore, the data can be selectively written into the plurality of tunneling magneto-resistance elements TMR arranged in a two-dimensional fashion by controlling supply of the data write currents to data write interconnections 210 and 215 in accordance with the address selection.

FIG. 18 conceptually shows a structure for reading data from the MTJ memory cell.

Structures similar to that in FIG. 18 are disclosed in technical references such as "A 10 ns Read and Write Non-Volatile Memory Array Using a Magnetic Tunnel Junction and FET Switch in each Cell", ISSCC Digest of Technical Papers, TA7.2, February 2000, "Nonvolatile RAM based on Magnetic Tunnel Junction Elements", ISSCC Digest of Technical Papers, TA7.3, February 2000, and "A 256 kb 3.0V 1T1MTJ Nonvolatile Magneto-resistive RAM", ISSCC Digest of Technical Papers, TA7.6, February 2001.

Referring to FIG. 18, the writing of data into the MTJ memory cell, i.e., into tunneling magneto-resistance element TMR is executed, as already described, by the magnetic fields, which are generated by the data write currents flowing through a digit line DL and a bit line BL, respectively. For example, digit line DL corresponds to data write line 210 shown in FIG. 17, and bit line BL corresponds to data write line 215.

As an access element for reading data from tunneling magneto-resistance element TMR, the structure is provided with an access transistor ATR, which is turned on and off in accordance with a voltage on a word line WL. Access transistor ATR is typically formed of a MOS (Metal Oxide Silicon) transistor. One of source/drain regions of access transistor ATR is electrically coupled to tunneling magneto-resistance element TMR, and the other is coupled to a fixed voltage such as a ground voltage.

In the data read operation, bit line BL is set to a voltage other than the above fixed voltage, and word line WL is activated to turn on access transistor ATR. Thereby, a current corresponding to the magnetization direction of tunneling magneto-resistance element TMR, i.e., a current corresponding to the storage data can be supplied to a current path including bit line BL and tunneling magneto-resistance element TMR via access transistor ATR. Therefore, by comparing the bit line current in this operation with a reference current, it is possible to determine whether the storage data in the MTJ memory cell formed of tunneling magneto-resistance element TMR is at an H-level or an L-level. Since the bit line current in the data read operation is much smaller than the data write current, the current flowing in the data read operation does not change the magnetization direction of tunneling magneto-resistance element TMR. Thus, the data reading can be performed in a nondestructive manner.

FIG. 19 conceptually shows a conventional layout of the MTJ memory cell formed of one tunneling magneto-resistance element TMR and one access transistor.

Referring to FIG. 19, an MTJ memory cell 10 according to a conventional layout has tunneling magneto-resistance element TMR, which is arranged at a crossing between bit BL arranged in the X direction and digit line DL arranged in the Y direction. As will be described below, tunneling magneto-resistance element TMR is coupled to access transistor ATR, which is turned on and off in response to the voltage on word line WL arranged in the Y direction, via a contact portion 15.

FIG. 20 is a cross section showing a structure taken along line P-P' in FIG. 19.

Referring to FIG. 20, digit line DL is formed at a first metal interconnection layer M1. Bit line BL is formed at a higher metal interconnection layer M2, and is coupled to tunneling magneto-resistance element TMR.

Access transistor ATR formed on a semiconductor main substrate SUB has source/drain regions 20 and 25 as well as a substrate region 27, which is formed between source/drain regions 20 and 25, and is located immediately under a gate (word line WL). In substrate region 27, a channel is formed corresponding to a voltage on word line WL coupled to the gate.

Source/drain region 25 is electrically coupled to the fixed voltage, and source/drain region 20 is electrically coupled to tunneling magneto-resistance element TMR via contact portion 15. In the following description, source/drain region 25 coupled to the fixed voltage may be merely referred to as "source region 25", and source/drain region 20 coupled to tunneling magneto-resistance element TMR may be merely referred to as "drain region 20". Access transistor ATR is isolated from the neighboring access transistor by an insulating and isolating film 30.

FIG. 21 conceptually shows a part of the memory array, in which the MTJ memory cells shown in FIG. 19 are arranged in rows and columns.

Referring to FIG. 21, MTJ memory cells 10 shown in FIG. 19 are arranged in rows and columns, and neighbor to each other in the X- and Y-directions. Memory cells neighboring to each other in the X direction form groups, each of which corresponds to the memory cell row. Memory cells neighboring to each other in the Y direction form groups, each of which corresponds to the memory cell column.

Bit line BL is arranged in the X direction, and is coupled to each of tunneling magneto-resistance elements TMR in the memory cells belonging to the corresponding memory cell row. Word line WL is arranged in the Y direction, and is coupled to the gate of each of access transistors in the memory cells belonging to the corresponding memory cell column. Digit lines DL extend in the Y direction, and are arranged corresponding to the memory cell columns, respectively.

Tunneling magneto-resistance element TMR is arranged with its longer side located in the Y direction. Therefore, the data write current flowing through digit line DL generates a magnetic field in the direction of hard axis (HA), and the data write current flowing through bit line BL applies the data write magnetic field in the direction of easy axis (EA).

FIG. 22 is a cross section showing structures taken along lines P-P' and Q-Q' in FIG. 21. Sections taken along lines P-P' and Q-Q' are present in neighboring two memory cell rows, respectively.

In the layout arrangement according to the prior art, MTJ memory cells 10 in each memory cell row have substantially the same structure (layout). Thus, a coupling layout between tunneling magneto-resistance element TMR and access transistor ATR in each MTJ memory cell 10 is substantially the same as those in the other MTJ memory cells.

As shown in FIG. 22, therefore, the P-P' section and the Q—Q section have substantially the same structures, and tunneling magneto-resistance elements TMR in each memory cell row are electrically coupled to access transistors ATR, which are electrically isolated from each other by insulating films 30, respectively. The coupling relationship between tunneling magneto-resistance element TMR and access transistor ATR in each MTJ memory cell 10 is substantially the same as that shown in FIG. 20, and therefore, description thereof is not repeated.

Word line WL for controlling on/off of access transistor ATR corresponds to a transistor gate interconnection, which extends in the Y direction through a gate layer for electrically coupling the gates of the access transistors belonging to the same memory cell column together. Thus, each word line WL is shared by all the MTJ memory cells, which belong to the same memory cell column, and therefore neighbor to each other in the Y direction.

In the layout arrangement according to the prior art, if the capacity of memory array increases, and the MTJ memory cells corresponding to each word line WL increase in number, a parasitic capacitance of word line WL remarkably increases. This results in lowering of the data read speed because the voltage on word line WL cannot be changed rapidly for turning on access transistor ATR.

A reference cell provided for generating a reference current to be compared with a passing current of the MTJ memory cell, which is designated as an access target and may also be referred to as a "selected memory cell" hereinafter, may be arranged in a region other than the memory array provided with the MTJ memory cells arranged in rows and columns. In this structure, a read margin may be impaired due to influences of noises and others in the data read operation.

SUMMARY OF THE INVENTION

An object of the invention is to provide a thin film magnetic memory device having a layout arrangement for achieving fast and accurate data reading.

In summary, a thin film magnetic memory device according to the invention includes a plurality of memory cells, a plurality of data lines, and first and second gate interconnections. The plurality of memory cells are arranged in rows and columns along first and second directions. The memory cells neighboring to each other in the first direction form first groups, and the memory cells neighboring to each other in the second direction form second groups.

The plurality of data lines are arranged in the first direction, and correspond to the first groups, respectively. The first and second gate interconnections are arranged in the second direction, and correspond to the second groups, respectively. Each memory cell includes a magneto-resistance element having an electric resistance variable in accordance with magnetically written storage data, and an access transistor for electrically coupling the magneto-resistance element between a fixed voltage and corresponding one among the plurality of data lines in a data read operation. Each access transistor is turned on and off in accordance with a voltage on the one gate interconnection selected from the corresponding one first gate interconnection and the corresponding one second gate interconnection of the plurality of first and second gate interconnections and predetermined for the first group.

Preferably, each of the memory cells has a layout inverted in the second direction with respect to that of the memory cell neighboring in the first direction.

Accordingly, the invention can achieve such as a major advantage that interconnection capacitances of the first and second gate interconnections can be lower than those of a structure, in which one gate interconnection is shared by the memory cells neighboring to each other in the second direction. Consequently, the access transistor in the memory cell selected as an access target can be rapidly turned on so that a data read operation can be performed fast.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the figures, the same reference numbers indicate the same or corresponding portions.

First Embodiment

Figure 1:
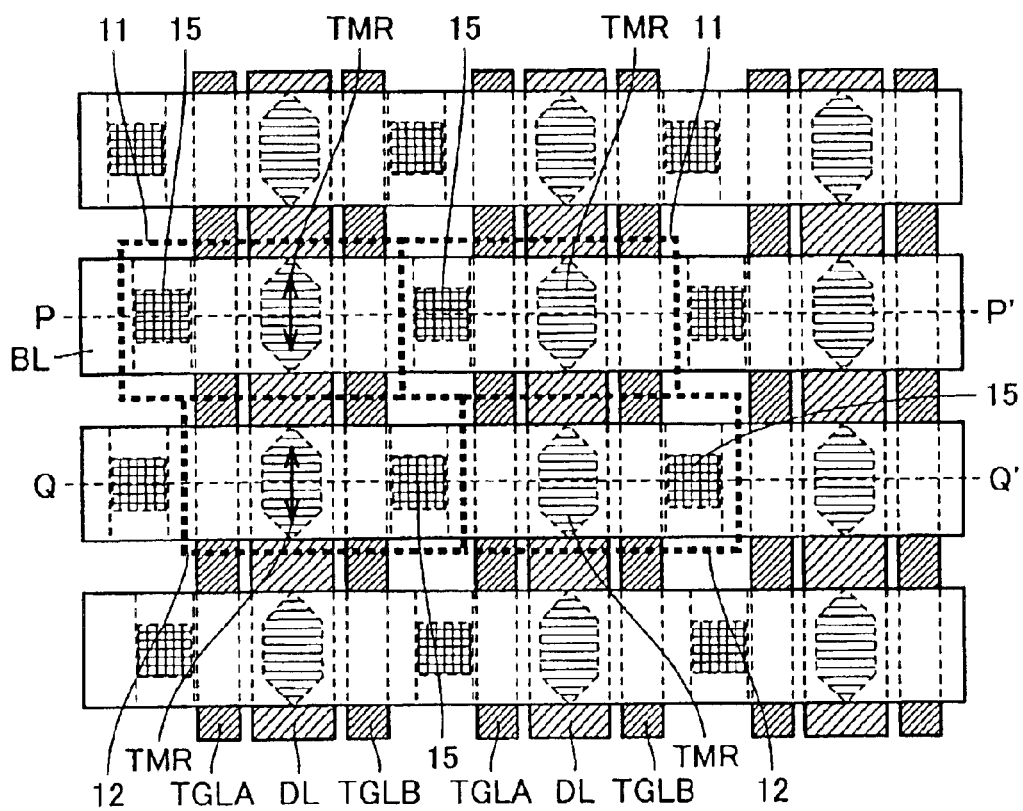
FIG. 1 conceptually shows a layout arrangement of MTJ memory cells in a thin film magnetic memory device according to a first embodiment.

FIG. 1 shows a layout arrangement of MTJ memory cells in a thin film magnetic memory device according to a first embodiment.

Referring to FIG. 1, a memory array 2 is provided with a plurality of MTJ memory cells arranged in rows and columns along X- and Y-directions. Similarly to the structure in FIG. 19, there are groups, each of which corresponds to the memory cell row, and includes the memory cells neighboring to each other in the X direction. Also, there are groups, each of which corresponds to the memory cell column, and includes the memory cells neighboring to each other in the Y direction.

In the layout arrangement according to the first embodiment, each of the MTJ memory cells has a layout inverted with respect to that of the neighboring MTJ memory cells in the same column. These two kinds of MTJ memory cells having different layouts are indicated as MTJ memory cells 11 and 12, respectively. For example, the second memory cell row (P-P') in FIG. 1 includes MTJ memory cells 11, which are continuously arranged in the X direction, and the third memory cell row (Q-Q') includes MTJ memory cells 12, which are continuously arranged in the X direction.

Figure 19:
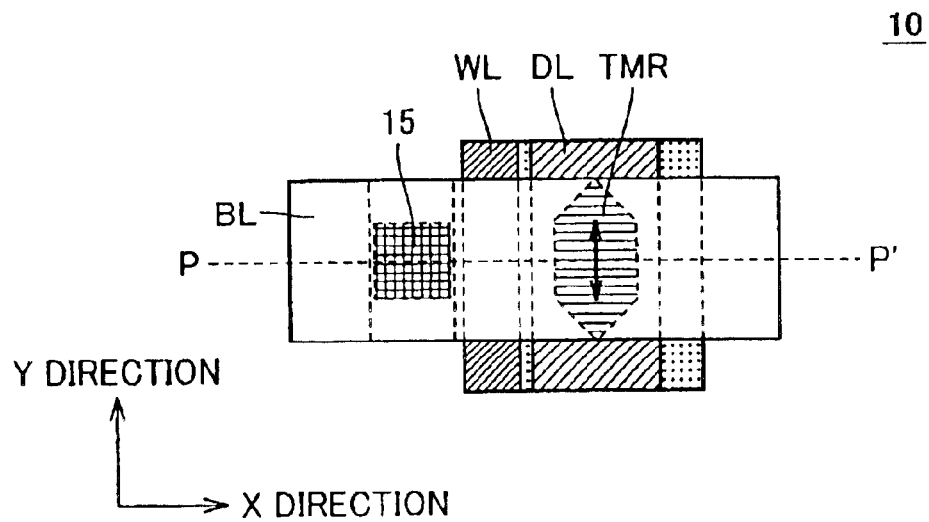
FIG. 19 conceptually shows a conventional layout of a MTJ memory cell formed of one tunneling magneto-resistance element TMR and one access transistor.

Similarly to the structure shown in FIG. 19, bit lines BL extend in the X direction, and are arranged corresponding the memory cell rows, respectively. Digit lines DL extend in the Y direction, and are arranged corresponding to the memory cell columns, respectively. In each of MTJ memory cells 11 and 12, tunneling magneto-resistance element TMR has its longer side extending in the Y direction.

In each memory cell column, transistor gate interconnections TGLA and TGLB are arranged in the Y direction. A difference in layout between MTJ memory cells 11 and 12 will now be described with reference to cross sections taken along lines P-P' and Q-Q' in FIG. 1.

Figure 2:
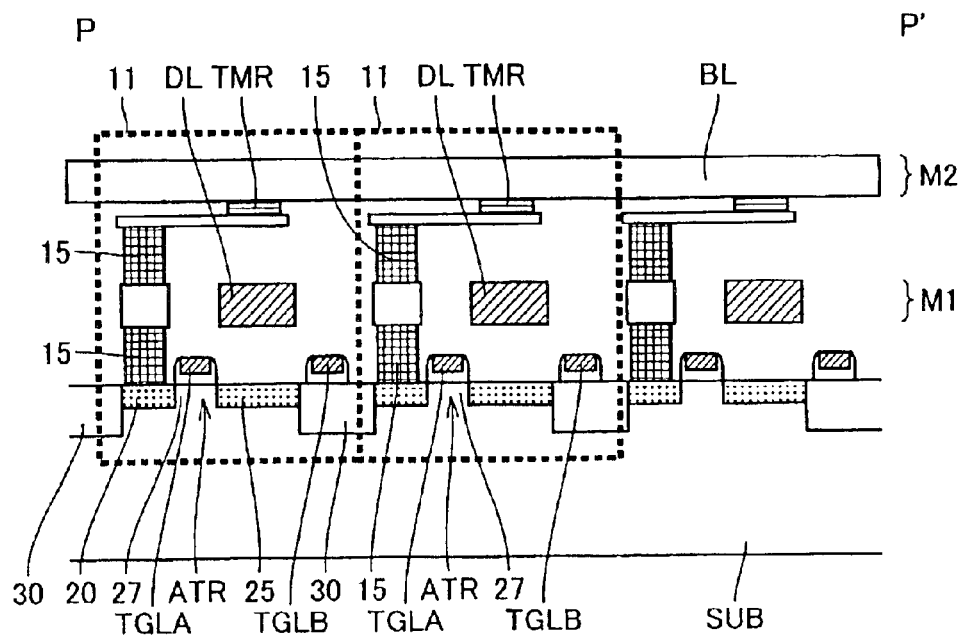
FIG. 2 is a cross section of the MTJ memory cells taken along line P-P' in FIG. 1.

FIG. 2 is a cross section of the MTJ memory cells taken along line P-P' in FIG. 1.

Referring to FIG. 2, MTJ memory cell 11 has tunneling magneto-resistance element TMR and access transistor ATR, similarly to MTJ memory cell 10 in the prior art. In MTJ memory cell 11, access transistor ATR has a drain region 20 and a source region 25 as well as a substrate region 27, which is formed between source/drain regions 20 and 25, and is located immediately under transistor gate interconnection TGLA. In substrate region 27, a channel is formed in accordance with a gate voltage, i.e., a voltage on transistor gate interconnection TGLA.

Figure 20:
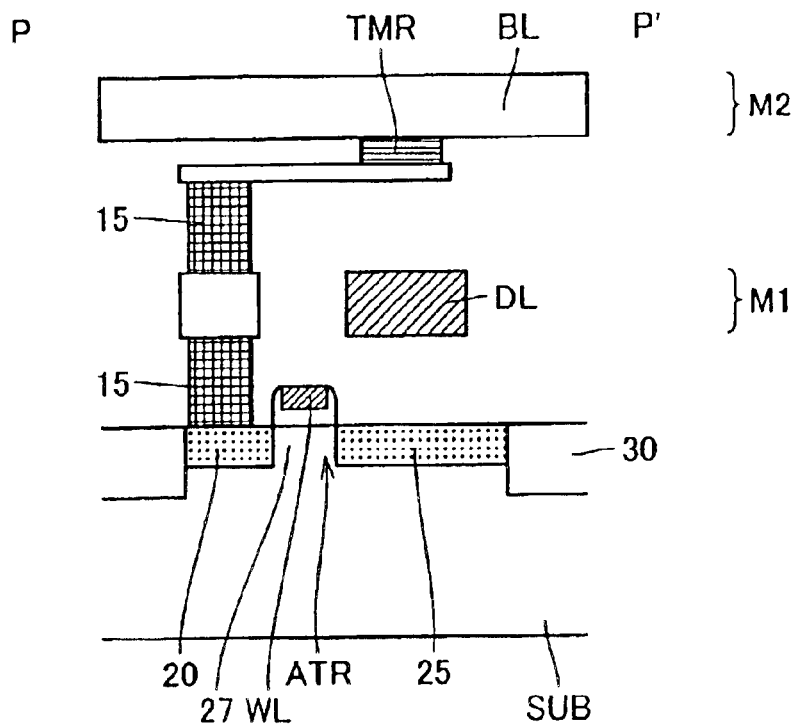
FIG. 20 is a cross section of a structure taken along line P-P' in FIG. 19.

Digit line DL and bit line BL are formed at first and second metal interconnection layers M1 and M2, similarly to the structure shown in FIG. 20. Tunneling magneto-resistance element TMR is electrically coupled to drain region 20 via a contact portion 15. Access transistors ATR in two MTJ memory cells 11 neighboring in the X direction are electrically isolated from each other by an insulating and isolating film 30 formed immediately under transistor gate interconnection TGLB. In general, insulating and isolating film 30 is formed of an oxide film similarly to a gate insulating film, which is formed between transistor gate interconnection TGLA and substrate region 27. However, such an oxide film is much thicker than the gate insulating film.

Figure 3:
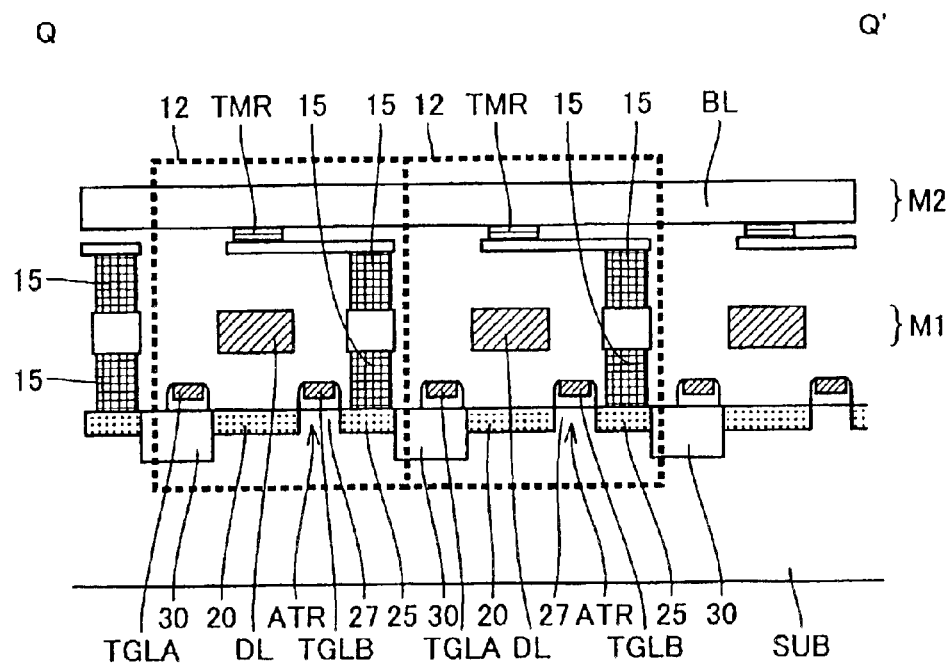
FIG. 3 is a cross section of the MTJ memory cells taken along line Q-Q' in FIG. 1.

FIG. 3 is a cross section of the MTJ memory cells taken along line Q-Q' in FIG. 1.

Referring to FIG. 3, MTJ memory cell 12 differs in layout from MTJ memory cell 11 neighboring thereto in the Y direction in that substrate region 27 providing the channel is formed between source/drain regions 20 and 25, and is located immediately under transistor gate interconnection TGLB, and that insulating and isolating film 30 electrically isolating access transistor ATR is formed immediately under transistor gate interconnection TGLA.

More specifically, each of MTJ memory cells 11 and 12 in the same memory cell column has two transistor gate interconnections TGLA and TGLB arranged in the Y direction, and one or the other of transistor gate interconnections TGLA and TGLB is coupled to the gate of access transistor ATR. In MTJ memory cell 11, access transistor ATR is turned on and off in accordance with a voltage on transistor gate interconnection TGLA. In MTJ memory cell 12, access transistor ATR is turned on and off in accordance with a voltage on transistor gate interconnection TGLB.

Substrate region 27 shown in FIGS. 2 and 3 is subjected to activation processing for forming the channel. On the activated region, a capacitance provided by the gate insulating film, which is formed between transistor gate interconnection TGLA or TGLB and substrate region 27, is coupled to transistor gate interconnection TGLA or TGLB. In a region provided at a lower level with insulating and isolating film 30, a capacitance provided by insulating and isolating film 30 is coupled to transistor gate interconnection TGLA or TGLB.

In view of the thicknesses of insulating and isolating film 30 and the gate oxide film, the capacitance coupled to the transistor gate interconnection by insulating and isolating film 30 is smaller than the capacitance coupled to the transistor gate interconnection by the gate insulating film on the substrate region (active region). As shown in FIG. 1, therefore, transistor gate interconnections TGLA and TGLB in alternate rows are used as gates of the access transistors, and the structures in the other rows are provided with insulating and isolating films 30 located under the transistor gate interconnections. Thereby, the interconnection capacitances of transistor gate interconnections TGLA and TGLB can be reduced.

Thereby, it is possible to reduce interconnection delays on transistor gate interconnections TGLA and TGLB in the data read operation, and thereby access transistor ATR can be rapidly turned on in the selected memory cell. Consequently, the data read operation can be performed fast.

Second Embodiment

A second embodiment will now be described in connection with a structure, in which the MTJ memory cells each having the layout according to the first embodiment and reference cells used for data reading are arranged in the same memory array.

Figure 4:
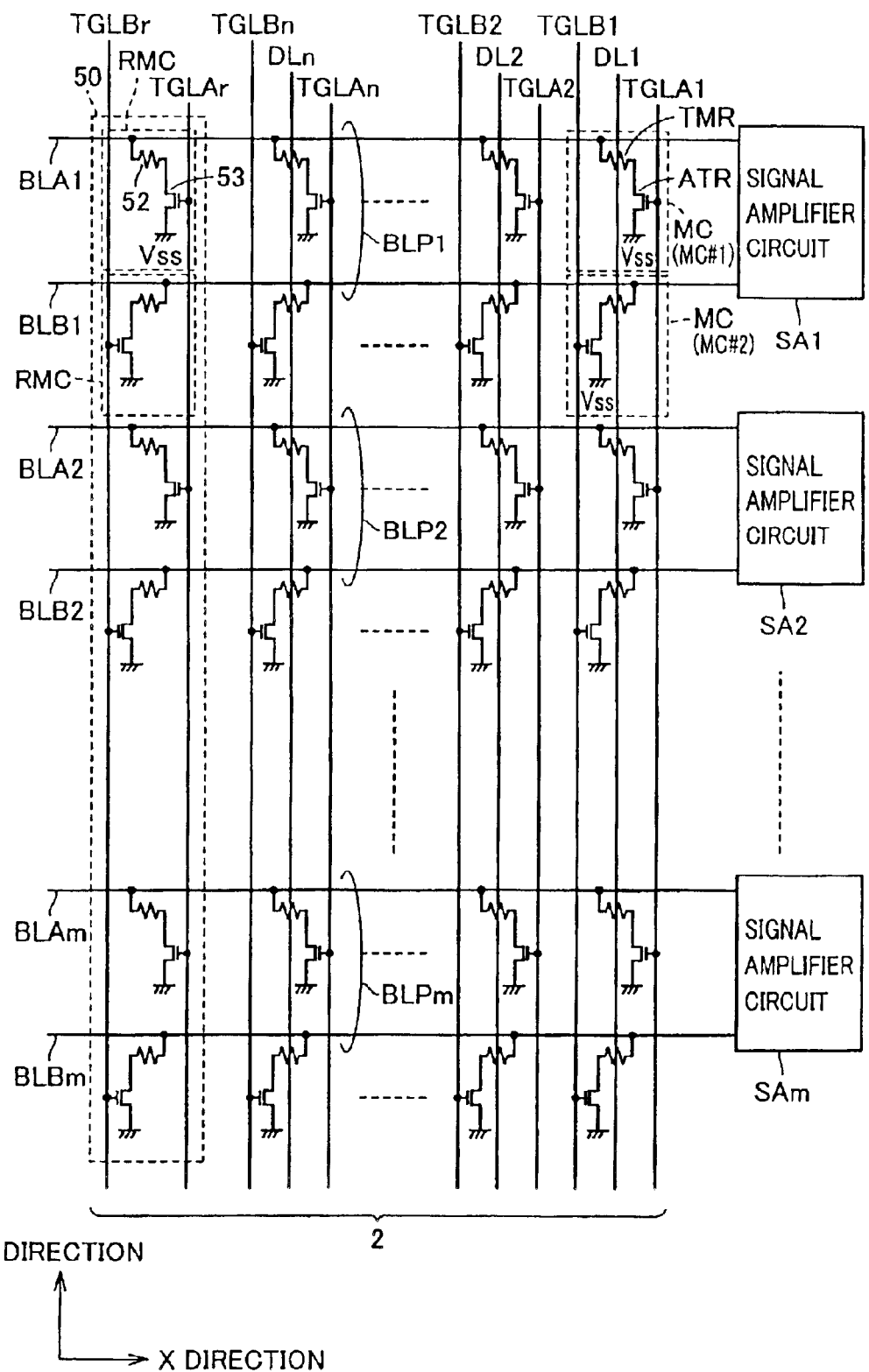
FIG. 4 conceptually shows a structure of a memory array according to a second embodiment.

FIG. 4 conceptually shows a structure of the memory array according to the second embodiment.

Referring to FIG. 4, memory array 2 is provided with MTJ memory cells MC of (n×2 m) in number and reference cells RMC of (1×2 m) in number, which are arranged in rows and columns to share the memory cell rows. The above numbers n and m are natural numbers, respectively.

For the shared 2 m rows of memory cell, lines BLA1, BLB1, . . . , BLAm and BLBm are arranged, respectively. In the following description, bit lines BLA1-BLAm may be merely referred to as "bit lines BLA", and bit lines BLB1-BLBm may be merely referred to as "bit lines BLB".

MTJ memory cells MC in alternate rows has the same arrangement layouts as MTJ memory cells 11 in FIG. 2 or MTJ memory cells 12 in FIG. 3. For example, each MTJ memory cell connected to bit line BLA has the same arrangement layout as MTJ memory cell 11 shown in FIG. 2, and each MTJ memory cell connected to bit line BLB has the same arrangement layout as MTJ memory cell 12 shown in FIG. 3.

Each bit line BLA and corresponding one bit line BLB form a bit line pair. For example, the structure shown in FIG. 4 is provided with bit line pairs BLP1-BLPm each formed of neighboring two bit lines. Further, signal amplifier circuits SA1-SAm are provided corresponding to bit line pairs BLP1-BLPm, respectively. In the following description, signal amplifier circuits SA1-SAm may be generally referred to as "signal amplifier circuits SA". Bit line pairs BLP1-BLPm may be generally and merely referred to as "bit line pairs BLP", hereinafter.

The plurality of reference cells RMC are arranged in the Y direction to form a reference cell column 50. Thus, reference cell column 50 is independent of the MTJ memory cell columns.

Digit lines DL1-DLm as well as transistor gate interconnections TGLA1 and TGLB1, . . . , and TGLAn and TGLBn, which extend in the Y direction, are arranged corresponding to the MTJ memory cell columns, respectively. Transistor gate interconnections TGLAr and TGLBr are arranged corresponding to reference cell columns 50, respectively. In the following description, transistor gate interconnections TGLA1-TGLAn may be generally referred to as "transistor gate interconnections TGLA", and transistor gate interconnections TGLB1-TGLBn may be generally referred to as "transistor gate interconnections TGLB".

In alternate columns, access transistors ATR in the MTJ memory cells connected to bit lines BLA (and having substantially the same layout arrangement as MTJ memory cell 11 shown in FIG. 2) have gates coupled to transistor gate interconnections TGLA, respectively, and access transistors ATR in the MTJ memory cells connected to bit lines BLB (and having substantially the same layout arrangement as MTJ memory cell 12 shown in FIG. 3) have gates coupled to transistor gate interconnections TGLB, respectively.

In each of reference cells RMC connected to respective bit lines BLA1-BLAm, an access element 53 has a gate connected to transistor gate interconnection TGLAr. In each of reference cells RMC connected to respective bit lines BLB1-BLBm, access element 53 has a gate connected to transistor gate interconnection TGLBr.

Each of reference cells RMC has a resistance element 52 and an access element 53, which are connected in series between corresponding bit line BLA or BLB and fixed voltage Vss (e.g., ground voltage). Access element 53 is formed of a field-effect transistor similarly to access transistor ATR in the MTJ memory cell. One reference cell RMC is provided for each of bit lines BLA1, BLB1, . . . BLAm and BLBm. Reference cell RMC has an electric resistance Rref equal to a value intermediate between two kinds of electric resistances Rmax and Rmin corresponding to the storage data of each tunneling magneto-resistance element TMR, and preferably equal to (Rmax+Rmin)/2. Thus, a passing current of reference cell RMC during data reading is set to a level intermediate between the two kinds of passing currents corresponding to the storage data of the MTJ memory cell.

For example, resistance element 52 may be designed similarly to tunneling magneto-resistance element TMR in MTJ memory cell MC, and the storage data corresponding to electric resistance Rmin may be stored in advance. Further, the transistor forming access element 53 may have a size different from that of access transistor ATR, or the gate voltage of access element 53, i.e., the H-level voltage on transistor gate interconnections TGLAr and TGLBr may be different from the level on transistor gate interconnections TGLA and TGLB corresponding to normal MTJ memory cell MC. Thereby, the foregoing characteristics of the reference cells can be achieved. Since it is not necessary to rewrite the stored data of resistance element 52, it is not particularly necessary to provide a digit line corresponding to reference cell column 50.

An operation of reading data from the memory array shown in FIG. 4 will now be described.

For example, if MTJ memory cell MC#1 belonging to the first row and first column is selected, each of bit lines BLA1-BLAm and BLB1-BLBm is charged to a predetermined voltage, and thereafter, transistor gate interconnection TGLA1 corresponding to selected memory cell MC#1 is activated to attain H-level. Thereby, tunneling magneto-resistance element TMR of selected memory cell MC#1 is connected between bit line BLA1 and fixed voltage Vss. Further, transistor gate interconnection TGLBr is activated to attain H-level so that access element 53 in reference cell RMC connected to bit line BLB1, which forms bit line pair BLP1 together with bit line BLA1, is turned on.

Thereby, a current corresponding to the electric resistance of tunneling magneto-resistance element TMR and thus corresponding to the storage data level of selected memory cell MC#1 flows through bit line BLA1. At the same time, a current corresponding to electric resistance Rref of reference cell RMC flows through bit line BLB1 paired with bit line BLA1. Signal amplifier circuit SA1 provided corresponding to bit line pair BPP1 detects and amplifies a difference between currents passing through bit lines BLA1 and BLB1 so that reading of the stored data is executed.

For example, if MTJ memory cell MC#2 belonging to the second row and first column is selected, each of bit lines BLA1-BLAm and BLB1-BLBm is charged to a predetermined voltage, and thereafter, transistor gate interconnection TGLA1 corresponding to selected memory cell MC#2 is activated to attain H-level. Further, transistor gate interconnection TGLAr is activated to attain H-level so that access element 53 in reference cell RMC connected to bit line BLA1, which forms bit line pair BLP1 together with bit line BLB1, is turned on.

Consequently, a current corresponding to the storage data of selected memory cell MC#2 flows through bit line BLB1, and a current corresponding to electric resistance Rref flows through bit line BLA1. Therefore, reading of the storage data can be executed by signal amplifier circuit SA1 detecting and amplifying a difference between currents passing through bit lines BLA1 and BLB1 forming bit line pair BLP1.

In the structure according to the second embodiment, since the memory cells having the layout arrangements similar to those in the first embodiment are arranged in rows and columns, it is possible to reduce parasitic capacitances of transistor gate interconnections TGLA and TGLB, and the data reading can be performed fast.

Further, the structure of the second embodiment can perform the data reading based on a so-called folded bit line structure in accordance with the difference in passing current between the bit lines connected to the selected memory cell and the reference cell, respectively. More specifically, the bit line connected to the reference cell and the bit line connected to the selected memory cell are arranged parallel to each other on the same memory cell array so that influences by noises appear substantially equally on these bit lines. Therefore, the data reading can be performed accurately with a large data read margin. Since signal amplifier circuit SA is arranged corresponding to each bit line pair, data can be read in parallel from many memory cells.

First Modification of the Second Embodiment

Figure 5:
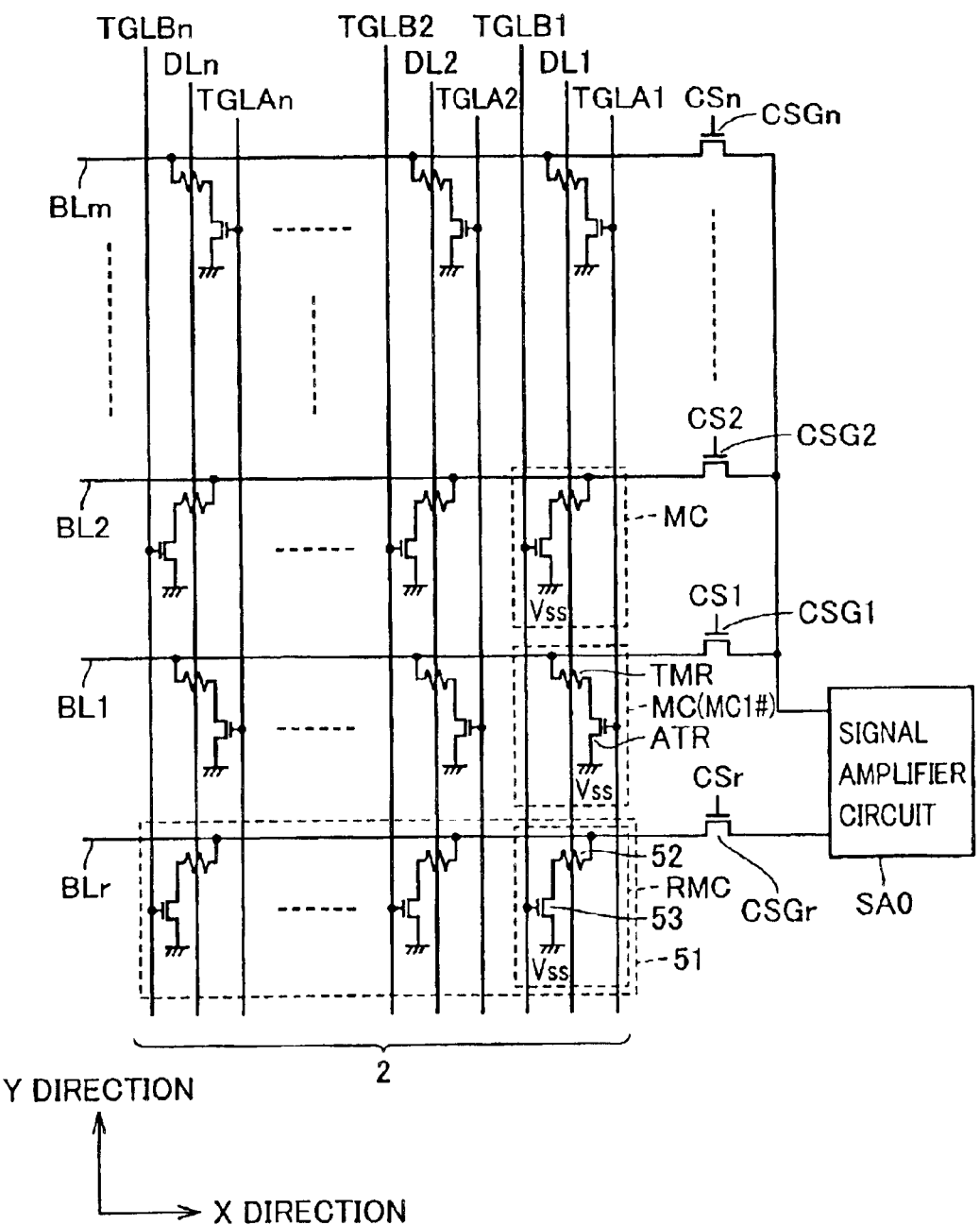
FIG. 5 conceptually shows a structure of a memory array according to a first modification of the second embodiment.

Referring to FIG. 5, a structure according to a first modification of the second embodiment includes a plurality of reference cells RMC, which are arranged in the X direction to form a reference cell row 51 in the same memory array 2 as normal MTJ memory cells MC. Reference cell RMC is formed of the same structure as that shown in FIG. 4, and has resistance element 52 and access element 53 connected in series.

In the structure according to the first modification of the second embodiment, normal MTJ memory cells MC and reference cells RMC in memory array 2 are arranged in rows and columns to share the memory cell columns. Reference cell row 51 is independent of the MTJ memory cell rows.

Corresponding to the n memory cell columns thus shared, digit lines DL1-DLn and transistor gate interconnections TGLA1 and TGLB1-TGLAn and TGLBn are arranged in the Y direction, respectively. Thus, each of digit lines DL1-DLn and transistor gate interconnections TGLA1 and TGLB1-TGLAn and TGLBn is shared by normal MTJ memory cells MC and reference cell RMC. Further, bit lines BL1-BLm extending in the X direction are arranged corresponding to the m MTJ memory cell rows, respectively, and reference bit line BLr extending in the X direction is arranged corresponding to reference cell row 51.

Similarly to the structure shown in FIG. 4, each of the gates of access transistors ATR of the MTJ memory cells in alternate rows are connected to transistor gate interconnections TGLA or transistor gate interconnections TGLB. The gate of access element 53 of each reference cell RMC is connected to one of transistor gate interconnections TGLA and TGLB.

Signal amplifier circuit SA0 is provided in common to bit lines BL1-BLm for detecting and amplifying a difference between currents passing through input nodes. One of the input nodes of signal amplifier circuit SA0 is connected to bit lines BL1-BLm via column select gates CSG1-CSGm, respectively. The other input node of signal amplifier circuit SA0 is connected to reference bit line BLr via column select gate CSGr.

Column select gates CSG1-CSGn are turned on and off in response to column select signals CS1-CSm, respectively, and column select gate CSGr is turned on and off in response to column select signal CSr. In the data read operation, one of column select signals CS1-CSm is activated to attain H-level in response to an address signal. In parallel with this, column select signal CSr is also activated to attain H-level, and column select gate CSGr is turned on. Further, transistor gate interconnections TGLA and TGLB corresponding to the selected memory cell are activated to attain H-level.

For example, if MTJ memory cell MC#1 belonging to the first row and first column is selected as the access target, bit lines BL1-BLA and reference bit line BLr are charged to a predetermined voltage, and thereafter transistor gate interconnections TGLA1 and TGLB1 are activated to attain H-level. Also, column select signals CS1 and CSr are activated to attain H-level. Therefore, bit line BL1, which is pulled down to fixed voltage Vss (ground voltage) via tunneling magneto-resistance element TMR in response to turn-on of access transistor ATR, and reference bit line BLr, which is pulled down to fixed voltage Vss via reference cell RMC, are connected to the input nodes of signal amplifier circuit SA0, respectively. Consequently, signal amplifier circuit SA0 can read the storage data from the selected memory cell in accordance with the passing current difference between reference bit line BLr and bit line BL1 corresponding to the selected memory cell.

As described above, the MTJ memory cell in the structure according to the first modification of the second embodiment has the layout arrangement similar to that of the first embodiment. Therefore, the parasitic capacitances of transistor gate interconnections TGLA and TGLB can be reduced, and the data reading can be performed fast. Since signal amplifier circuit SA0 is shared by the plurality of bit lines BL1-BLm, the structure for reading the data of one bit can be simplified.

Second Modification of the Second Embodiment

Figure 6:
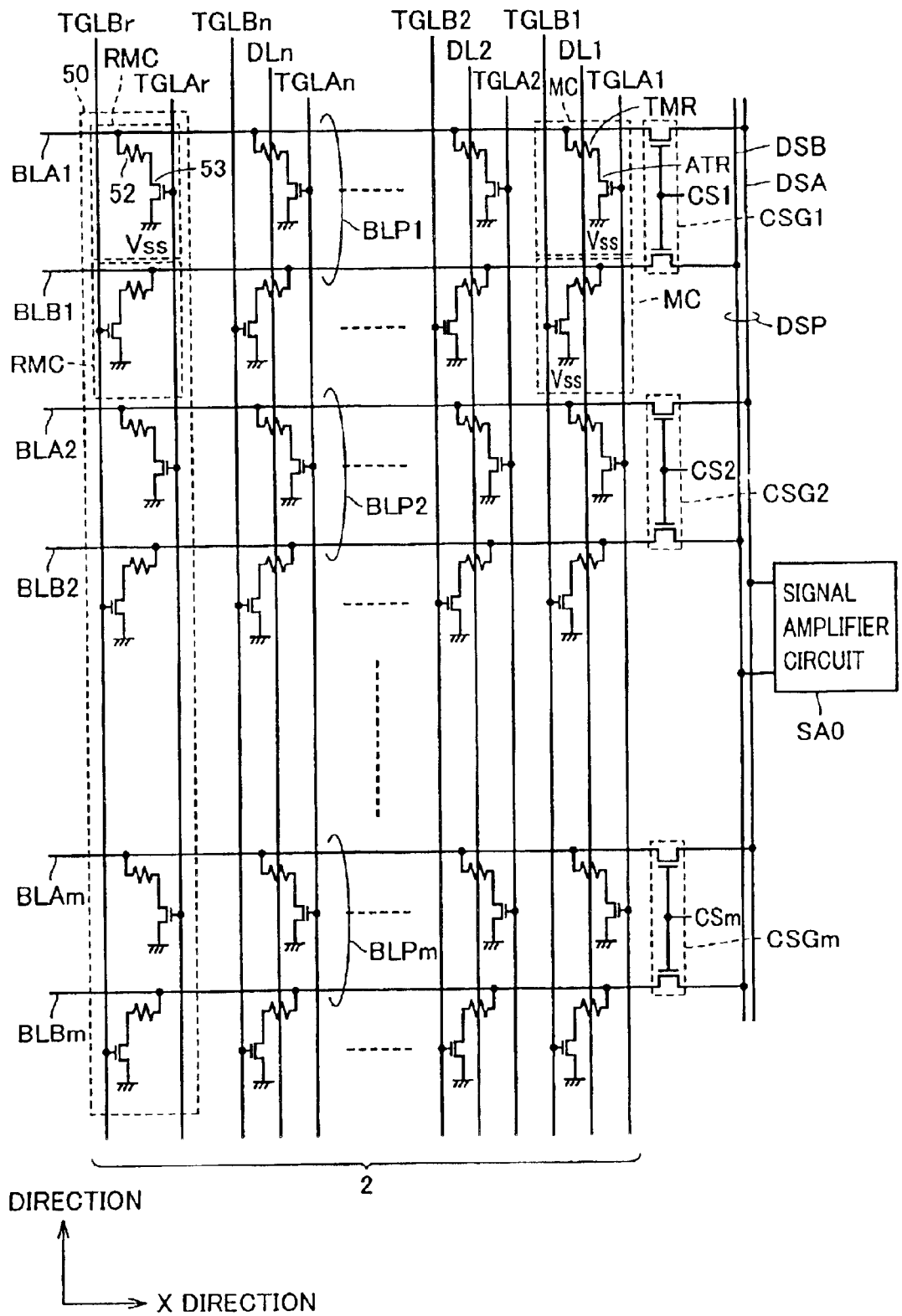
FIG. 6 conceptually shows a structure of a memory array according to a second modification of the second embodiment.

Referring to FIG. 6, a structure according to a second modification of the second embodiment differs from the structure of the second embodiment shown in FIG. 4 in that the signal amplifier circuit is shared by the plurality of bit lines pairs BLP1-BLPm. More specifically, signal amplifier circuit SA0 shared by these bit line pairs is used in place of signal amplifier circuits SA1-SAm in FIG. 4, and the input nodes of signal amplifier circuit SA0 are connected complementary data lines DSA and DSB forming each data lines pair DSP, respectively.

Column select gates CSG1-CSGm are arranged between data line pair DSP and bit line pairs BLP1-BLPm, respectively. For example, column select gate CSG1 has a transistor switch electrically coupled between data line DSA and bit line BLA1, and a transistor switch electrically coupled between data line DSB and bit line BLB1. Gates of these transistor switches are supplied with column select signal CS1. Column select gates CSG2-CSGm having similar structures are arranged for other bit line pairs BLP2-BLPm, respectively.

In the data read operation, one of column select signals CS1-CSm corresponding to the selected memory cell is activated to attain H-level. Further, as already described with reference to FIG. 4, transistor gate interconnections TGLA and TGLB provided corresponding to the MTJ memory cells and transistor gate interconnections TGLAr and TGLBr provided corresponding to reference cell column 50 are selectively activated to attain H-level.

Thereby, signal amplifier circuit SA0 amplifies the difference between passing currents of the selected memory cell and the reference cell based on the folded bit line structure so that reading of data from the selected memory cell can be executed. As described above, the structure according to the second modification of the second embodiment can execute a fast data read operation with a high read margin based on the folded bit line structure similar to that of the second embodiment. Further, the signal amplifier circuit required for outputting the data of one bit can be small in number so that the chip area can be reduced.

Source region 25, which is coupled to fixed voltage Vss (ground voltage) in access transistor ATR as shown in cross sections of FIGS. 2 and 3, may extend in the Y direction on memory array 2. More specifically, source regions 25 in the access transistors ATR corresponding to the same memory cell column are mutually and electrically coupled so that source region 25 can be used directly as the source line for transmitting fixed voltage Vss (e.g., ground voltage). The source lines thus provided may be made of a metal compound, and more specifically may have a salicide structure made of a silicide compound such as CoSi for lowering an electric resistance.

As a result, the memory array structures shown in FIGS. 4 and 6 are not required to employ a new metal interconnection for fixing source region 25 of access transistor ATR at fixed voltage Vss (ground voltage), and the data reading can be performed fast. In other words, if the source line had a high electric resistance, it would be necessary to add a metal interconnection, which is coupled between each source region 25 and fixed voltage Vss for a shunt.

In the memory array structure shown in FIG. 5, it is not necessary to provide a new metal interconnection for fixing source region 25 of access transistor ATR at fixed voltage Vss (ground voltage), and the data read margin can be increased. In other words, if the source line had a high electric resistance, the source line portions on current paths including reference cell RMC and the selected memory cell would have different electric resistances, respectively. Therefore, it would be necessary to provide a new metal interconnection, which is coupled between each source region 25 and fixed voltage Vss for a shunt.

Third Embodiment

In the structure of the reference cell of the second embodiment, at least the access element must be different in design of the transistor size and gate voltage in the on state from the access transistor in the normal MTJ memory cell. A third embodiment will now be described in connection with a data read structure having reference cell RMC, which can have substantially the same structure as normal MTJ memory cell MC, and can be controlled to turn on and off its access element substantially in the same manner as normal MTJ memory cell MC.

Figure 7:
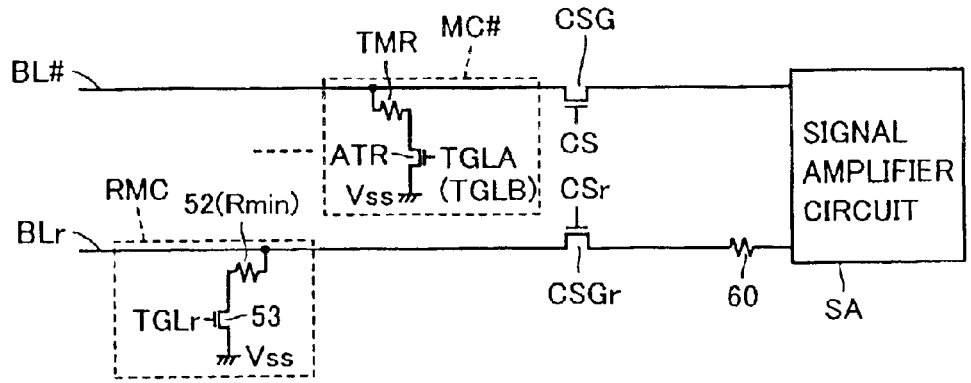
FIG. 7 is a circuit diagram showing a first example of a data read structure according to a third embodiment.
Figure 8:
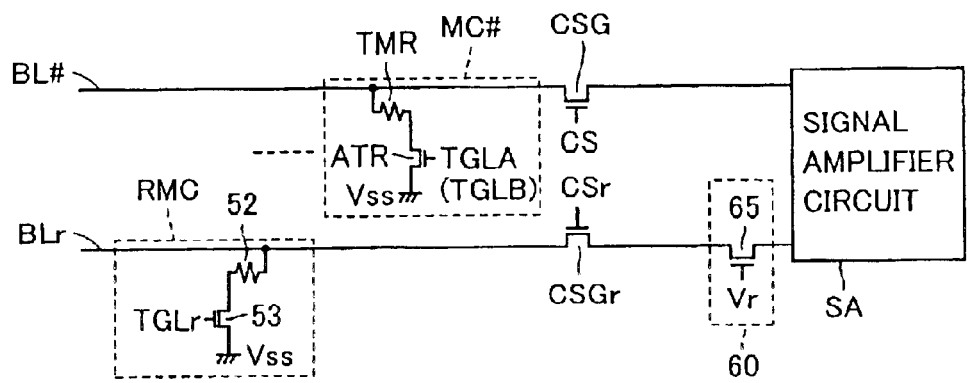
FIG. 8 is a circuit diagram showing a second example of the data read structure according to the third embodiment.
Figure 9:
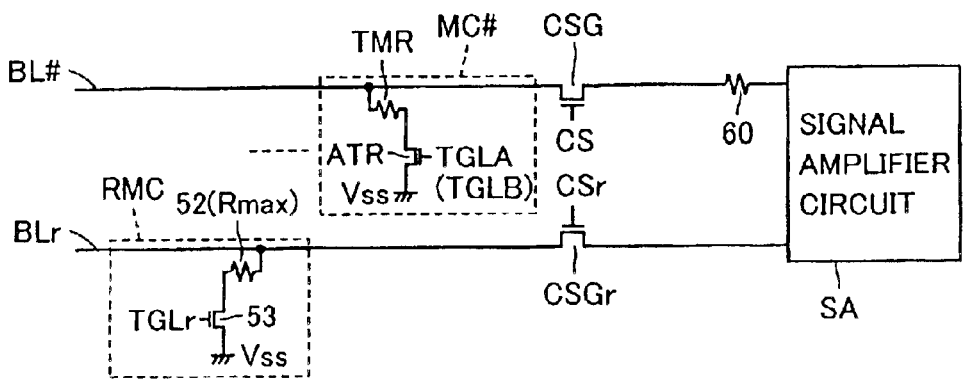
FIG. 9 is a circuit diagram showing a third example of the data read structure according to the third embodiment.

FIGS. 7 to 9 are circuit diagrams showing a data read structure according to a third embodiment. FIGS. 7 to 9 show a memory array structure, in which reference cells RMC are arranged in the X direction to form a reference cell row, and particularly show only structures of portions required for comparing a passing current path of selected memory cell MC# with a passing current path of reference cell RMC.

Referring to FIG. 7, access transistor ATR in selected memory cell MC# is turned on in response to activation of corresponding transistor gate interconnection TGLA (or TGLB). Thereby, corresponding bit line BL#, which may also be referred to as a "selected bit line" hereinafter, is pulled down to fixed voltage Vss (ground voltage) via tunneling magneto-resistance element (electric resistance Rmax or Rmin). In reference cell RMC, access element 53 is turned on in response to the activation (i.e., H-level) of corresponding transistor gate interconnection TGLBr. Thereby, reference bit line BLr is pulled down to fixed voltage Vss (ground voltage) via resistance element 52.

In the above structure, resistance element 52 and access element 53 are designed and produced similarly to tunneling magneto-resistance element TMR and access transistor ATR in MTJ memory cell MC, respectively, and resistance element 52 stores in advance the storage data corresponding to electric resistance Rmin. Further, the H-level voltages of transistor gate interconnections TGLAr and TGLBr for turning on access element 53 are substantially set to the same level as the H-level voltages on transistor gate interconnections TGLA and TGLB turning on access transistor ATR.

In response to the activation of column select signals CS and CSr corresponding to the selected memory cell, column select gates CSG and CSGr are turned on so that selected bit lines BL# and reference bit line BLr are electrically coupled to the input nodes of signal amplifier circuit SA, respectively. An additional resistance 60 arranged in series with reference bit line BLr is connected between reference bit line BLr and signal amplifier circuit SA. Additional resistance 60 has an electric resistance smaller than $\Delta R$ (=Rmax−Rmin) and preferably equal to $\Delta R/2$.

Accordingly, even in the case where the reference cell RMC can be designed, manufactured and controlled similarly to normal memory cell MC as already described, the passing current of reference cell RMC can be set to an intermediate level between two kinds of passing currents corresponding to the storage data of selected memory cell MC#. As a result, the data read operation similar to that shown in FIG. 5 can be executed by using the reference cells, which can be manufactured similarly to the MTJ memory cells, and thus can be manufactured without requiring changes in manufacturing steps and design.

As shown in FIG. 8, additional resistance 60 may be formed of a field-effect transistor 65 receiving a control voltage Vr on its gate. Field-effect transistor 65 can be used as a variable resistance element, of which electric resistance can be finely adjusted in accordance with control voltage Vr. Consequently, the same effect as that of the structure shown in FIG. 7 can be achieved, and additionally, the electric resistance of additional resistance 60 can be accurately set to a designed value, e.g., of $\Delta R/2$ while reflecting thereon the actual variations during manufacturing of memory cells MC and reference cells RMC.

Instead of the above structures, additional resistance 60 may be connected in series to selected bit line BL#. In this structure, storage data corresponding to electric resistance Rmax is written into resistance element 53 (similar to tunneling magneto-resistance element TMR) in the reference cell.

Consequently, a sum of the electric resistances connected in series to selected bit line BL#, i.e., a sum of electric resistances of tunneling magneto-resistance element TMR and additional resistance 60 in selected memory cell MC# becomes equal to (Rmin+$\Delta R/2$) or (Rmax+$\Delta R/2$). In contrast to this, the electric resistance connected in series to reference bit line BLr, i.e., the electric resistance of resistance element 52 is equal to Rmax (Rmin+$\Delta R/2$<Rmax<Rmax+$\Delta R/2$). In the structure shown in FIG. 9, therefore, data can be read from the selected memory cell by detecting and amplifying the difference in passing current between selected bit line BL# and reference bit line BLr, similarly to the structures of FIGS. 7 and 8.

Additional resistance 60 shown in FIG. 9 may be formed of a field-effect transistor, of which control voltage can be finely controlled, similarly to the structure shown in FIG. 8.

Modification of the Third Embodiment

A modification of the third embodiment will now be described in connection with a circuit structure, in which a structure similar to that of the third embodiment is applied to a memory array for executing the data reading based on the folded bit line structure, e.g., shown in FIG. 4 or 6.

Figure 10:
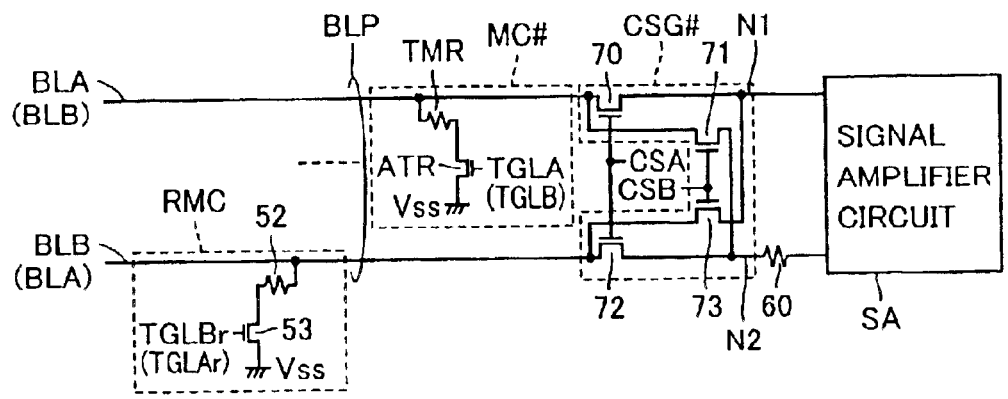
FIG. 10 is a circuit diagram showing a first example of the data read structure according to a modification of the third embodiment.

FIG. 10 is a circuit diagram showing a data read structure according to the modification of the third embodiment. FIG. 10 likewise shows only structures of portions required for comparing a passing current path of selected memory cell MC# with a passing current path of reference cell RMC.

In the structure according to the modification of the third embodiment, as shown in FIG. 10, resistance element 52 and access element 53 forming reference cell RMC are designed, produced and controlled similarly to access transistor ATR and tunneling magneto-resistance element TMR in normal memory cell MC, respectively. Storage data corresponding to electric resistance Rmin is written in advance in resistance element 52.

As already described, selected memory cell MC# is connected to one of bit lines BLA and BLB, and corresponding reference cell RMC is connected to the other of bit lines BLA and BLB. FIG. 10 shows by way of example a structure, in which selected memory cell MC# is connected to bit line BLA.

Column select gate CSG# is arranged between signal amplifier circuit SA and bit lines BLA and BLB. Similar column select gate CSG# is arranged corresponding to each bit line pair BLP. Column select gate CSG# includes a transistor switch 70 electrically coupled between bit line BLA and a node N1, a transistor switch 71 electrically coupled between bit line BLA and a node N2, a transistor switch 72 electrically coupled between bit line BLB and node N2, and a transistor switch 73 electrically coupled between bit line BLB and node N1. Each of gates of transistor switches 70 and 72 receives a column select signal CSA, and each of gates of transistor switches 71 and 73 receives a column select signal CSB.

Further, additional resistance 60 is connected between node N2 and one of the input nodes of signal amplifier circuit SA. When selected memory cell MC# is connected to bit line BLA as shown in FIG. 10, column select signal CSA is activated to attain H-level so that bit line BLA is directly connected to the input node of signal amplifier circuit SA, and bit line BLB connected to reference cell RMC is connected to the input node of signal amplifier circuit SA with additional resistance 60 connected in series therebetween.

Therefore, the passing current difference between bit lines BLA and BLB, which is detected on the input nodes of signal amplifier circuit SA, is similar to the passing current difference between selected bit line BL# and reference bit line BLr in the structure shown in FIG. 7. Consequently, an effect similar to that of the third embodiment can be achieved even in the folded bit line structure.

In the structure shown in FIG. 10, additional resistance 60 may be connected to the side of node N1, similarly to the structure shown in FIG. 9. In this case, storage data corresponding to electric resistance Rmax is written into resistance element 52.

Figure 11:
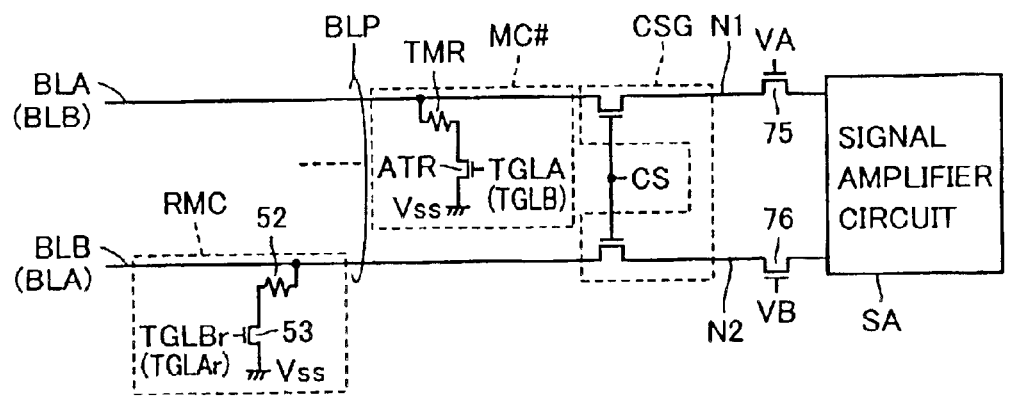
FIG. 11 is a circuit diagram showing a second example of the data read structure according to the modification of the third embodiment.

As shown in FIG. 11, field-effect transistors 75 and 76 serving as additional resistances may be connected between the input nodes of signal amplifier circuit SA and nodes N1 and N2, respectively. Transistors 75 and 76 receive independent control voltages VA and VB on their gates, respectively.

Further, in the structure shown in FIG. 11, column select gate CSG is arranged in place of column select gate CSG# shown in FIG. 10. More specifically, column select gate CSG has a transistor switch connected between bit line BLA and node N1 as well as a transistor switch connected between bit line BLB and node N2, and these transistor switches commonly receive column select signal CS on their gates. In the structure shown in FIG. 11, therefore, the structure of column select gate can be simpler than that in the structure shown in FIG. 10.

Control voltages VA and VB are set to different levels, respectively, so that a difference of $\Delta R/2$ may be present between the electric resistances of transistors 75 and 76 serving as additional resistances. For example, the electric resistance of resistance element 52 in reference cell RMC may be set to the value of Rmin, and selected memory cell MC# may be connected to bit line BLA. In this case, the control voltage is set such that the electric resistance of transistor 76 may be larger than that of transistor 75 by $\Delta R/2$, while keeping a relationship of (VA>VB).

Conversely, if selected memory cell MC# is connected to bit line BLB, the control voltage is set such that the electric resistance of transistor 75 may be larger than that of transistor 76 by $\Delta R/2$, while keeping a relationship of (VB>VA).

As described above, the structure shown in FIG. 11 differs from the structure shown in FIG. 10 in that the column select gate has a simplified structure, and further the fine control can be performed to provide an appropriate passing current of the reference cell in accordance with the actual values of electric resistances of MTJ memory cell MC and reference cell RMC after the production.

Fourth Embodiment

A fourth embodiment will now be described in connection with an arrangement of the layouts according to the first embodiment.

Figure 12A:
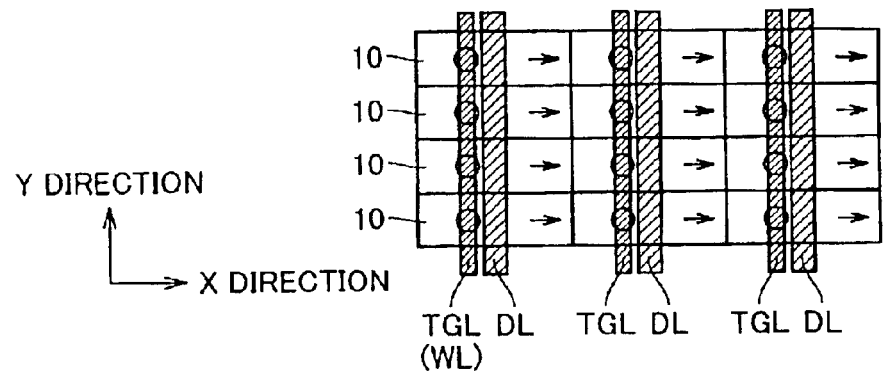
FIGS. 12A–12C conceptually show a layout arrangement of MTJ memory cells according to a fourth embodiment.
Figure 12B:
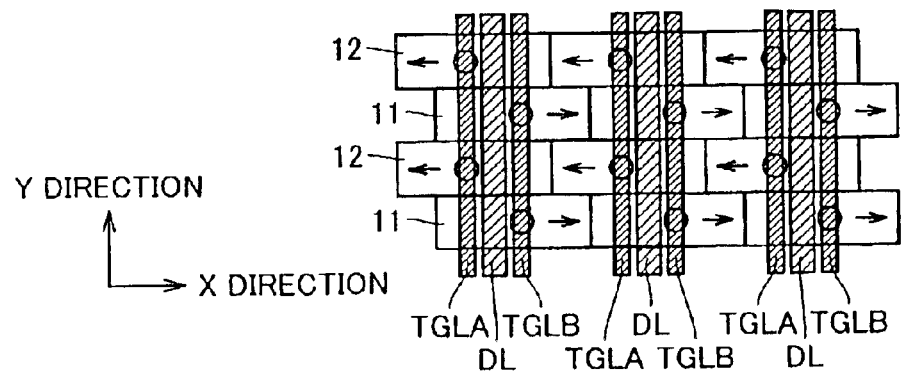
Figure 12C:
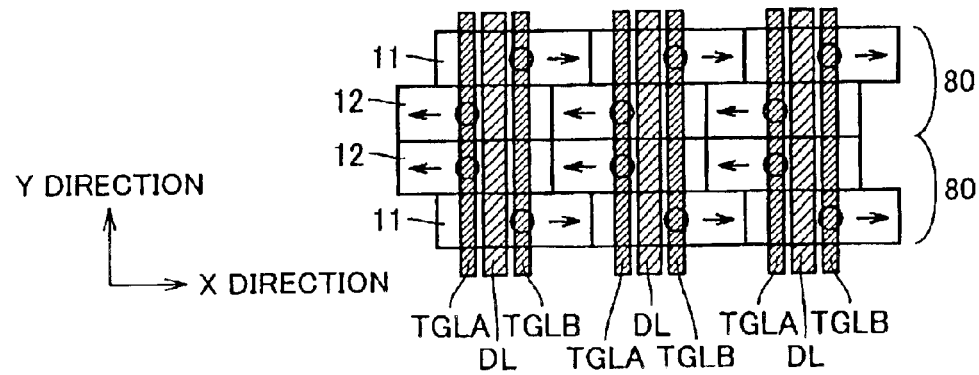

FIGS. 12A–12C show layout arrangements of the memory cells according to the fourth embodiment.

Figure 21:
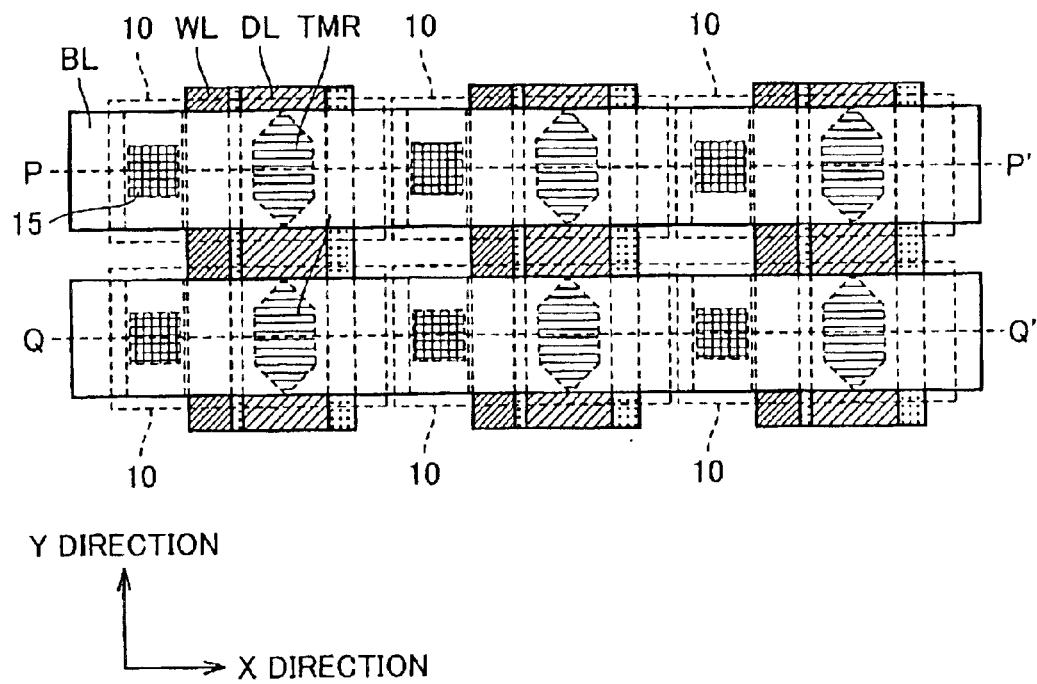
FIG. 21 conceptually shows a part of memory array provided with the MTJ memory cells arranged in rows and columns and shown in FIG. 19.
Figure 22:
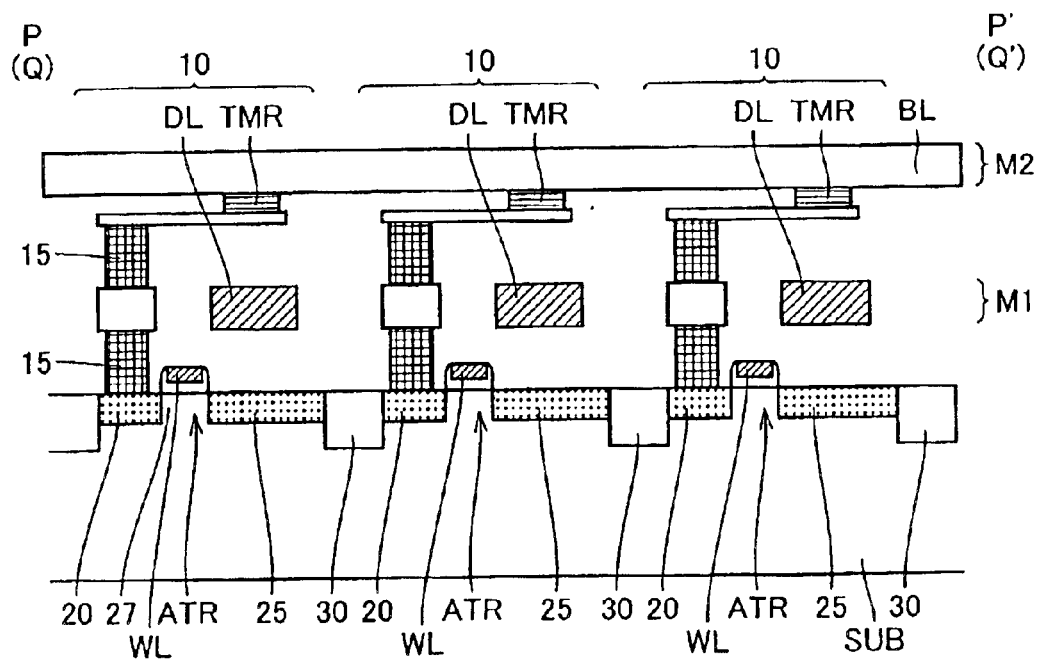
FIG. 22 is a cross section of structures taken along lines P-P' and Q-Q' in FIG. 21.

FIG. 12A shows a layout arrangement of the memory cells according to the prior art shown in FIG. 21. More specifically, the memory array is formed of MTJ memory cells 10 having the same layout arrangement and continuously arranged in the X and Y directions. Each transistor gate interconnection TGL (word line WL) arranged in the Y direction is connected to the gates of access transistors in MTJ memory cells 10 neighboring to each other in the Y direction.

FIG. 12B shows a layout arrangement according to the first embodiment. More specifically, MTJ memory cells 11 neighboring to each other in the X direction are arranged in alternate rows, and MTJ memory cells 12 neighboring to each other in the X direction are arranged in the other alternate rows. Therefore, the MTJ memory cells neighboring to each other in the Y direction have layouts inverted with respect to each other. Therefore, one or the other of two transistor gate interconnections TGLA and TGLB provided corresponding to the same memory cell column is connected to the gate of each access transistor so that each of transistor gate interconnections TGLA and TGLB has a smaller interconnection capacitance than transistor gate interconnection TGL shown in FIG. 12A.

FIG. 12C shows a layout arrangement according to the fourth embodiment. In the structure according to the fourth embodiment, the layout arrangements of the MTJ memory cells in neighboring two rows are inverted with respect to the layout arrangements of the MTJ memory cells in the next two rows. More specifically, as shown in FIG. 12C, if each memory cell in the first row has the layout arrangement of MTJ memory cell 11, MTJ memory cells 12 neighboring to each other in the X direction are arranged in the second and third rows. In the following fourth row and fifth row (not shown), the memory cells having the layout arrangements corresponding to MTJ memory cells 11 are continuously arranged in the X direction.

In the layout arrangement shown in FIG. 12C, one memory cell row formed of MTJ memory cells 11 and one memory cell row formed of MTJ memory cells 12 form a set 80. Bit line pairs BLP shown in FIG. 4 are arranged for these sets 80, respectively.

In the above structure, the MTJ memory cells in neighboring two rows have the layout arrangements inverted with respect to those of the MTJ memory cells in the next two rows. Even this structure can likewise execute fast and accurate data reading, similarly to the structures of the first to third embodiments.

Fifth Embodiment

A fifth embodiment will now be described in connection with another example of the layout arrangement of the MTJ memory cell.

Figure 13:
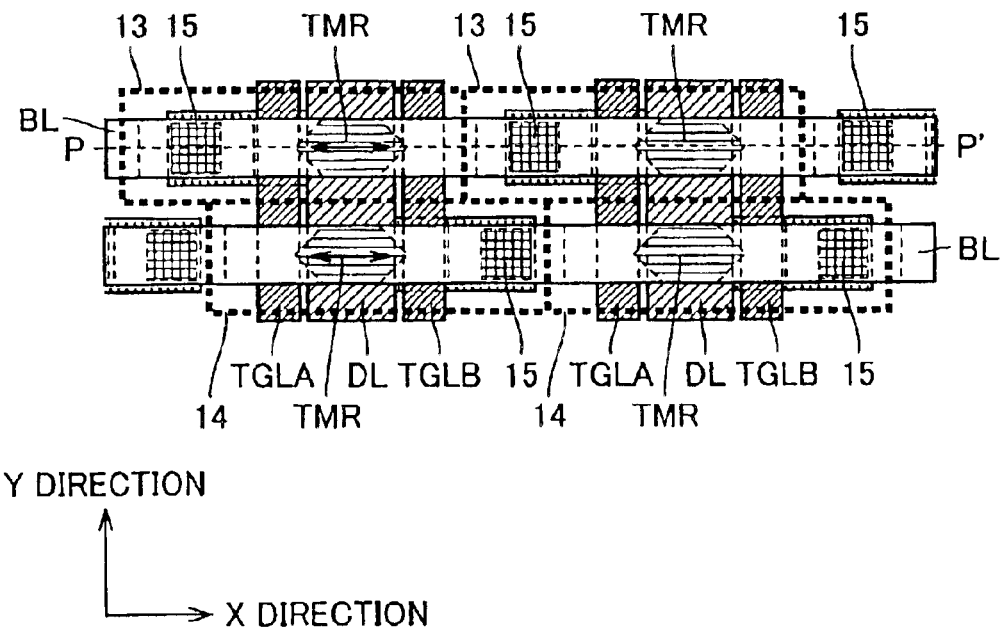
FIG. 13 conceptually show a layout arrangement of MTJ memory cells according to a fifth embodiment.

Referring to FIG. 13, the layout arrangement according to the fifth embodiment differs from that of the first embodiment in that the X and Y directions of tunneling magneto-resistance element TMR change places. More specifically, tunneling magneto-resistance element TMR has a long side in the X direction and a short side in the Y direction.

In accordance with the above, MTJ memory cells 11 and 12 shown in FIG. 1 are replaced with MTJ memory cells 13 and 14. More specifically, the MTJ memory cells in alternate rows are inverted with respect to the those in the other rows so that the memory cell rows each including MTJ memory cells 13 continuously arranged in the X direction are arranged alternately with respect to the memory cell rows each including MTJ memory cells 14 continuously arranged in the X direction. Alternatively, a structure similar to that according to the fourth embodiment may be employed so that the MTJ memory cells in the adjacent two rows have the layouts inverted with respect to those in the next two rows.

Figure 14:
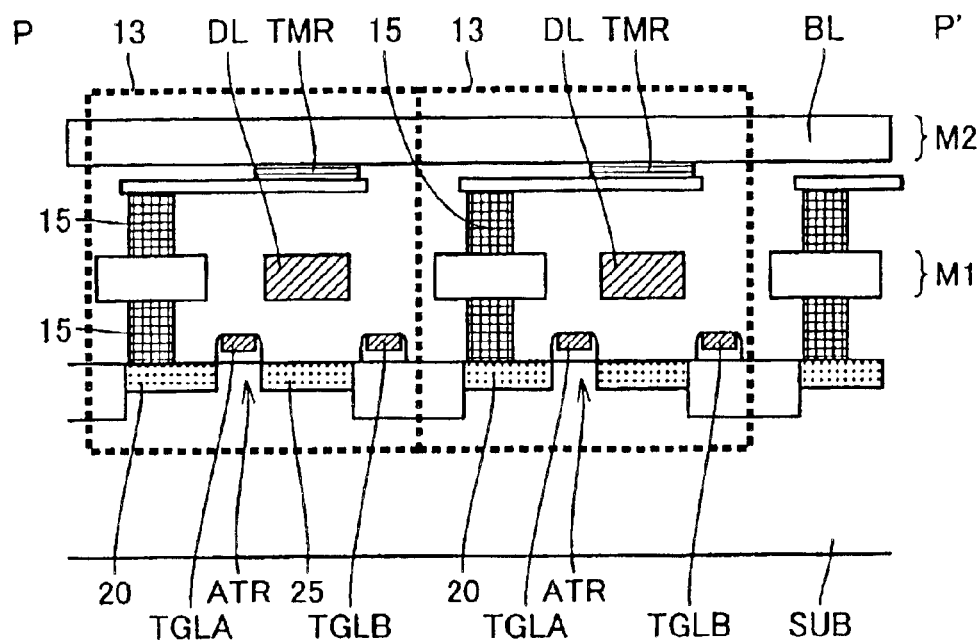
FIG. 14 is a cross section of the MTJ memory cells taken along line P-P' in FIG. 13.
Figure 15:
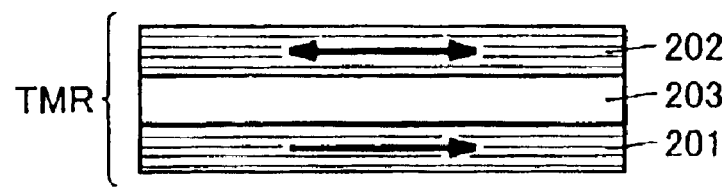
FIG. 15 conceptually shows a data storing principle of the MTJ memory cell.
Figure 16:
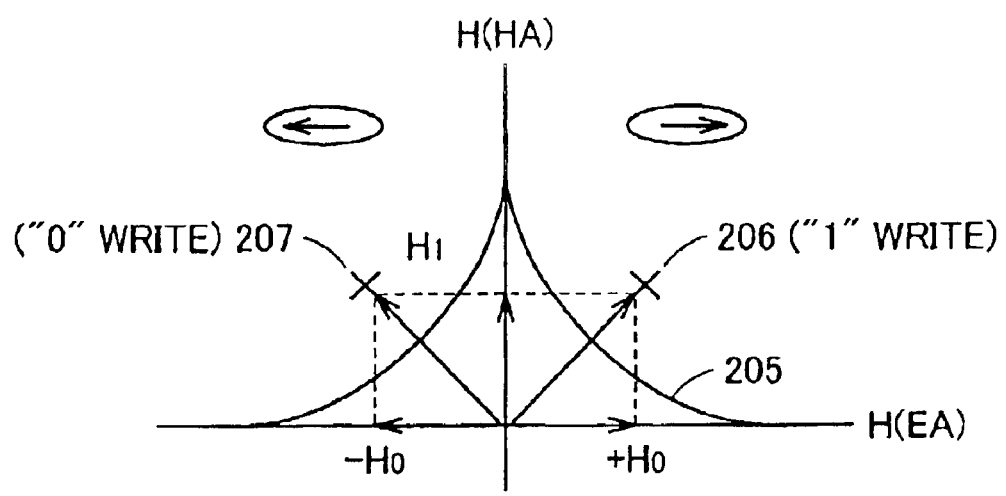
FIG. 16 conceptually shows data write magnetic fields applied to the MTJ memory cell in a data write operation.
Figure 17:
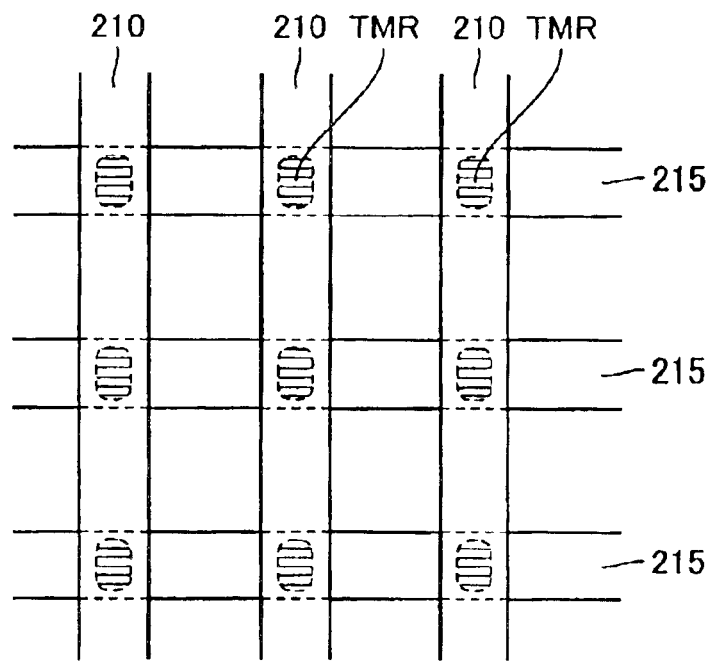
FIG. 17 conceptually shows an arrangement of data write lines in a memory cell array formed of MTJ memory cells.
Figure 18:
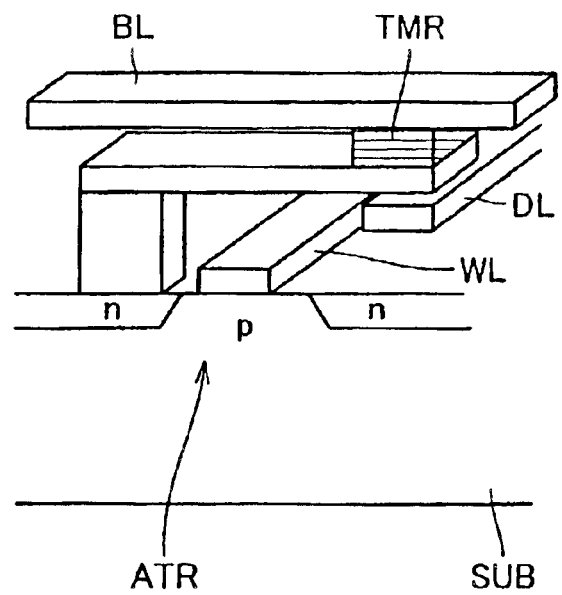
FIG. 18 conceptually shows a structure for reading data from a MTJ memory cell.

FIG. 14 is a cross section of the MTJ memory cells taken along line P-P' in FIG. 13.

Referring to FIG. 14, MTJ memory cell 13 according to the fifth embodiment has substantially the same structure as MTJ memory cell 11 shown in FIG. 2. More specifically, MTJ memory cells 13 and 11 have substantially the same connection relationships except for that the directions of arrangement (directions of the long and short sides) of tunneling magneto-resistance element TMR change places. Therefore, description of such connection relationships is not repeated.

Although not shown, the structure of MTJ memory cell 14 is substantially the same as that of MTJ memory cell 12 shown in FIG. 3 except for that the directions of arrangement of tunneling magneto-resistance element TMR change places.

In MTJ memory cell 13 thus arranged, insulating and isolating film 30 of a large thickness is formed under transistor gate interconnection TGLB. In MTJ memory cell 14, insulating and isolating film 30 is formed under the other transistor gate interconnection TGLA. Therefore, the interconnection capacitance of each of transistor gate interconnections TGLA and TGLB is suppressed.

In MTJ memory cell 13, access transistor ATR is turned on and off in accordance with one (TGLA) of two transistor gate interconnections TGLA and TGLB arranged in the Y direction, similarly to MTJ memory cell 11 shown in FIG. 1. In MTJ memory cell 14, access transistor ATR is turned on and off in accordance with the other (TGLB) of two transistor gate interconnections TGLA and TGLB, similarly to MTJ memory cell 12 shown in FIG. 1.

Referring to FIG. 13 again, the structure according to the fourth embodiment differs from that according to the first embodiment in that easy (EA) and hard axes (HA) of tunneling magneto-resistance element TMR change places. Therefore, bit line BL in the X direction is selectively supplied with the data write current in a uniform direction for designating the memory cell row as the write target, and bit line BL in the Y direction is selectively supplied with the data write current in a direction corresponding to the level of the write data.

MTJ memory cells 13 and 14 according to the fifth embodiment can have shorter lengths in the longitudinal direction (Y direction) than MTJ memory cells 11 and 12 according to the first embodiment, and therefore can have reduced cell sizes. According to general design rules, MTJ memory cells 10, 11 and 12 of the first embodiment and the prior art are arranged such that tunneling magneto-resistance element TMR of an elongated form may be longitudinally long, and therefore may have a cell size of $15F^2$, where F represent a minimum interconnection pitch. In contrast to this, MTJ memory cells 13 and 14 according to the fifth embodiment can have an improved cell size of $14F^2$. Consequently, the data read operation can be performed fast, and further, the cell size and therefore the chip area can be reduced.

MTJ memory cells 13 and 14 according to the fifth embodiment may be employed in combination with the structures of the second to fourth embodiments and/or the modifications thereof.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:
a plurality of memory cells arranged in rows and columns along first and second directions, said memory cells neighboring to each other in said first direction forming first groups, and said memory cells neighboring to each other in said second direction forming second groups;
a plurality of data lines arranged in said first direction, and corresponding to said first groups, respectively; and
a plurality of first and second gate interconnections arranged in said second direction, and corresponding to said second groups, respectively, wherein each of said memory cells includes;
a magneto-resistance element having an electric resistance variable in accordance with magnetically written storage data, and
an access transistor for electrically coupling said magneto-resistance element between a fixed voltage and corresponding one of said plurality of data lines in a data read operation;
each of said access transistors is turned on and off in accordance with a voltage on the one gate interconnection selected from the corresponding one first gate interconnection and the corresponding one second gate interconnection among said plurality of first and second sate interconnections and predetermined for said first group; and
each of said memory cells has a layout inverted in said second direction with respect to that of the memory cell neighboring in said first direction.

2. A thin film magnetic memory device comprising:
a plurality of memory cells arranged in rows and columns along first and second directions, said memory cells neighboring to each other in said first direction forming first groups, and said memory cells neighboring to each other in said second direction forming second groups;
a plurality of data lines arranged in said first direction, and corresponding to said first groups, respectively; and
a plurality of first and second gate interconnections arranged in said second direction, and corresponding to said second groups, respectively, wherein
each of said memory cells includes:
a magneto-resistance element having an electric resistance variable in accordance with magnetically written storage data, and
an access transistor for electrically coupling said magneto-resistance element between a fixed voltage and corresponding one of said plurality of data lines in a data read operation;
each of said access transistors is turned on and off in accordance with a voltage on the one gate interconnection selected from the corresponding one first gate interconnection and the corresponding one second gate interconnection among said plurality of first and second gate interconnections and predetermined for said first group; and
said one gate interconnection predetermined for said first group alternates with the one gate interconnection predetermined for the neighboring first group.

3. A thin film magnetic memory device comprising:
a plurality of memory cells arranged in rows and columns along first and second directions, said memory cells neighboring to each other in said first direction forming first groups, and said memory cells neighboring to each other in said second direction forming second groups;

a plurality of data lines arranged in said first direction, and corresponding to said first groups, respectively; and a plurality of first and second gate interconnections arranged in said second direction, and corresponding to said second groups, respectively, wherein each of said memory cells includes:

a magneto-resistance element having an electric resistance variable in accordance with magnetically written storage data, and an access transistor for electrically coupling said magneto-resistance element between a fixed voltage and corresponding one of said plurality of data lines in a data read operation;

each of said access transistors is turned on and off in accordance with a voltage on the one gate interconnection selected from the corresponding one first gate interconnection and the corresponding one second gate interconnection among said plurality of first and second gate interconnections and predetermined for said first group; and said one gate interconnection predetermined for each of the neighboring two first groups alternates with the one gate interconnection predetermined for the next two first groups.

4. A thin film magnetic memory device comprising:

a plurality of memory cells arranged in rows and columns alone first and second directions, said memory cells neighboring to each other in said first direction forming first groups, and said memory cells neighboring to each other in said second direction forming second groups;

a plurality of data lines arranged in said first direction, and corresponding to said first groups, respectively; and a plurality of first and second gate interconnections arranged in said second direction, and corresponding to said second groups, respectively, wherein each of said memory cells includes:

a magneto-resistance element having an electric resistance variable in accordance with magnetically written storage data, and an access transistor for electrically coupling said magneto-resistance element between a fixed voltage and corresponding one of said plurality of data lines in a data read operation;

each of said access transistors is turned on and off in accordance with a voltage on the one gate interconnection selected from the corresponding one first gate interconnection and the corresponding one second gate interconnection among said plurality of first and second gate interconnections and predetermined for said first group;

said first and second gate interconnections located in a region provided with said plurality of memory cells are located in parallel with each other on the opposite sides of said magneto-resistance element, respectively;

said access transistor has:

a source region coupled to said fixed voltage, a drain region electrically coupled to said magneto-resistance element via a contact portion, and a substrate region formed immediately under the predetermined one gate interconnection and located between said source region and said drain region; and said thin film magnetic memory device further comprises an insulating and isolating region formed immediately under the gate interconnection selected from said first and second gate interconnections and spaced from the predetermined one gate interconnection with said magneto-resistance element therebetween.

5. The thin film magnetic memory device according to claim 4, wherein said source region is made of a metal compound, and extends in said second direction for electrically and mutually coupling said source regions in the access transistor group corresponding to the same second group.

6. A thin film magnetic memory device comprising:

a plurality of memory cells arranged in rows and columns along first and second directions, said memory cells neighboring to each other in said first direction forming first groups, and said memory cells neighboring to each other in said second direction forming second groups;

a plurality of data lines arranged in said first direction, and corresponding to said first groups, respectively; and a plurality of first and second gate interconnections arranged in said second direction, and corresponding to said second groups, respectively, wherein each of said memory cells includes:

a magneto-resistance element having an electric resistance variable in accordance with magnetically written storage data, and an access transistor for electrically coupling said magneto-resistance element between a fixed voltage and corresponding one of said plurality of data lines in a data read operation;

each of said access transistors is turned on and off in accordance with a voltage on the one gate interconnection selected from the corresponding one first gate interconnection and the corresponding one second gate interconnection among said plurality of first and second gate interconnections and predetermined for said first group; the thin film magnetic memory device, further comprising:

a plurality of reference cells arranged in said first direction on the same array as said plurality of memory cells;

a reference data line electrically coupled to said fixed voltage via one of said plurality of reference cells in said data read operation; and a signal amplifier for performing data reading by amplifying a difference between passing currents of said reference data line and the one data line included in said plurality of data lines and connected to the selected memory cell designated as an access target, wherein the passing current of each of said reference cells in said data read operation is set to a level intermediate between two kinds of passing currents each corresponding to said storage data in said selected memory cell.

7. The thin film magnetic memory device according to claim 1, wherein said plurality of data lines are classified into first data lines to be turned on/off by said access transistors in the corresponding first group in accordance with the voltage on said corresponding first gate interconnection, and second data lines to be turned on/off by said access transistors in the corresponding first group in accordance with the voltage on said corresponding second gate interconnection;

a set including one of said first data lines and one of said second data lines forms a data line pair;

said thin film magnetic memory device further comprises:

a plurality of reference cells arranged in said second direction on the same array as said plurality of memory cells, and a signal amplifier for performing data reading by amplifying a difference between passing currents of said first and second data lines forming the same data line pair;

the first and second data lines forming the data line pair corresponding to the selected memory cell designated as an access target among said plurality of memory cells are electrically coupled to said fixed voltage via one and the other of said selected memory cell and one of said plurality of reference cells; and the passing current of each of said reference cells in said data read operation is set to a level intermediate between two kinds of passing currents of said selected memory cell each corresponding to said storage data.

8. The thin film magnetic memory device according to claim 7, wherein each of said magneto-resistance elements has a first or second electric resistance in accordance with the storage data;

said reference cell includes:

a resistance element prepared by designing and manufacturing similar to those of said magneto-resistance element, and bearing prewritten data corresponding one of said first and second electric resistances, and an access element connected in series to said resistance element and between said reference bit line and said fixed voltage, and prepared by designing and manufacturing similar to said access transistor;

said thin film magnetic memory device further comprises an additional resistance connected in series to at least one of said reference cell and said selected memory cell in the data read operation; and said additional resistance has an electric resistance smaller than a difference between said first and second electric resistances.

9. The thin film magnetic memory device according to claim 8, wherein said additional resistance has a field-effect transistor having an adjustable gate voltage.

10. A thin film magnetic memory device comprising:

a plurality of memory cells arranged in rows and columns along first and second directions, said memory cells neighboring to each other in said first direction forming first groups, and said memory cells neighboring to each other in said second direction forming second groups;

a plurality of data lines arranged in said first direction, and corresponding to said first groups, respectively; and a plurality of first and second gate interconnections arranged in said second direction, and corresponding to said second groups, respectively, wherein each of said memory cells includes:

a magneto-resistance element having an electric resistance variable in accordance with magnetically written storage data, and an access transistor for electrically coupling said magneto-resistance element between a fixed voltage and corresponding one of said plurality of data lines in a data read operation;

each of said access transistors is turned on and off in accordance with a voltage on the one gate interconnection selected from the corresponding one first gate interconnection and the corresponding one second gate interconnection among said plurality of first and second gate interconnections and predetermined for said first group;

said magneto-resistance element has an elongated form having a long side direction and a short side direction, and said plurality of data lines are arranged along said long side direction.

11. A thin film magnetic memory device comprising:

a plurality of memory cells arranged in rows and columns along first and second directions, said memory cells neighboring to each other in said first direction forming first groups, and said memory cells neighboring to each other in said second direction forming second groups;

a plurality of data lines arranged in said first direction, and corresponding to said first groups, respectively; and a plurality of first and second sate interconnections arranged in said second direction, and corresponding to said second groups, respectively, wherein each of said memory cells includes:

a magneto-resistance element having an electric resistance variable in accordance with magnetically written storage data, and an access transistor for electrically coupling said magneto-resistance element between a fixed voltage and corresponding one of said plurality of data lines in a data read operation;

each of said access transistors is turned on and off in accordance with a voltage on the one gate interconnection selected from the corresponding one first gate interconnection and the corresponding one second gate interconnection among said plurality of first and second gate interconnections and predetermined for said first group;

said magneto-resistance element has an elongated form having a long side direction and a short side direction, and said plurality of data lines are arranged along said short side direct.

12. A thin film magnetic memory device comprising:

a plurality of memory cells arranged in rows and columns along first and second directions, said memory cells neighboring to each other in said first direction forming first groups, and said memory cells neighboring to each other in said second direction forming second groups;

a plurality of data lines arranged in said first direction, and corresponding to said first groups, respectively;

a plurality of first and second gate interconnections for data read arranged in said second direction, and corresponding to said second groups, respectively, and a plurality of digit lines for data write arranged in said second direction, and corresponding to said second groups, respectively, wherein
the memory cells belonging to the same second group are corresponding to a same one of said digit lines in common,
each of said memory cells includes:
  a magneto-resistance element having an electric resistance variable in accordance with magnetically written storage data, and
  an access transistor for electrically coupling said magneto-resistance element between a fixed voltage and corresponding one of said plurality of data lines in a data read operation; and
each of said access transistors is turned on and off in accordance with a voltage on the one gate interconnection selected from the corresponding one first gate interconnection and the corresponding one second gate interconnection among said plurality of first and second gate interconnections and predetermined for said first group.

* * * * *